United States Patent
Fechner et al.

(10) Patent No.: US 8,975,952 B2
(45) Date of Patent: Mar. 10, 2015

(54) CMOS LOGIC CIRCUIT USING PASSIVE INTERNAL BODY TIE BIAS

(71) Applicant: Honeywell International Inc., Morristown, NJ (US)

(72) Inventors: Paul S. Fechner, Plymouth, MN (US); Weston Roper, Shakopee, MN (US); James D. Seefeldt, Eden Prairie, MN (US)

(73) Assignee: Honeywell International Inc., Morristown, NJ (US)

( * ) Notice: Subject to any disclaimer, the term of this patent is extended or adjusted under 35 U.S.C. 154(b) by 119 days.

(21) Appl. No.: 13/675,828

(22) Filed: Nov. 13, 2012

(65) Prior Publication Data

US 2014/0132306 A1 May 15, 2014

(51) Int. Cl.
*H03K 3/01* (2006.01)
*H03K 19/094* (2006.01)

(52) U.S. Cl.
CPC .......... *H03K 19/09421* (2013.01); *H03K 3/01* (2013.01)
USPC .......... 327/534; 327/537; 327/107; 327/166; 327/176; 326/103

(58) Field of Classification Search
CPC .......... H01L 27/0629; H01L 27/0218; H03K 19/0948; H03K 19/0013; H03K 19/0027; H03K 19/00384; H03K 2217/0018; H03K 17/08142; H03K 17/145; H03K 19/00361; H03K 2217/0036; H03K 3/011
USPC ........ 327/534, 537, 566; 326/32, 34, 103, 81, 326/83
See application file for complete search history.

(56) References Cited

U.S. PATENT DOCUMENTS

| | | | | |
|---|---|---|---|---|
| 5,103,277 | A * | 4/1992 | Caviglia et al. ............... | 257/348 |
| 6,307,233 | B1 * | 10/2001 | Awaka et al. .................. | 257/368 |
| 6,351,176 | B1 * | 2/2002 | Houston ........................ | 327/534 |
| 6,373,321 | B1 * | 4/2002 | Yamauchi et al. ............ | 327/534 |
| 6,404,269 | B1 | 6/2002 | Voldman | |
| 6,580,293 | B1 | 6/2003 | Bernstein et al. | |
| 6,593,799 | B2 * | 7/2003 | De et al. ........................ | 327/534 |
| 6,596,554 | B2 | 7/2003 | Unnikrishnan | |
| 6,638,799 | B2 | 10/2003 | Kotani | |

(Continued)

FOREIGN PATENT DOCUMENTS

| | | |
|---|---|---|
| JP | 62150761 A | 7/1987 |
| JP | 2002246600 | 8/2002 |

(Continued)

OTHER PUBLICATIONS

Search Report from counterpart European Application No. 13188197.1, dated Mar. 24, 2014, 3 pp.

(Continued)

*Primary Examiner* — Vibol Tan
(74) *Attorney, Agent, or Firm* — Shumaker & Sieffert, P.A.

(57) ABSTRACT

This disclosure is directed to devices, integrated circuits, systems, and methods for implementing an internal body tie bias circuit in a CMOS logic circuit. In one example, a CMOS logic circuit is formed in an integrated circuit. The CMOS logic circuit includes a PMOS transistor, an NMOS transistor; and a body tie bias circuit formed in the integrated circuit. The body tie bias circuit is coupled between a body tie connection terminal of the PMOS transistor and a body tie connection terminal of the NMOS transistor.

18 Claims, 5 Drawing Sheets

(56) References Cited

U.S. PATENT DOCUMENTS

| | | |
|---|---|---|
| 7,256,560 B2 | 8/2007 | Beulich et al. |
| 7,368,976 B2 * | 5/2008 | Gupta et al. ............... 327/534 |
| 7,456,478 B2 * | 11/2008 | Tsutsumi ................... 257/360 |
| 7,532,066 B1 | 5/2009 | Struble et al. |
| 7,560,172 B2 | 7/2009 | Chang et al. |
| 7,619,459 B2 | 11/2009 | Ryan |
| 7,732,287 B2 | 6/2010 | Fechner et al. |
| 7,847,616 B2 * | 12/2010 | Hashimoto ................ 327/534 |
| 8,004,316 B2 * | 8/2011 | Fish et al. ................. 326/121 |
| 8,138,839 B2 | 3/2012 | Gupta et al. |
| 2006/0006923 A1 | 1/2006 | Kapoor |
| 2006/0232313 A1 | 10/2006 | Favard |

FOREIGN PATENT DOCUMENTS

| | | |
|---|---|---|
| JP | 2002261292 | 9/2002 |
| JP | 2004072063 | 3/2004 |

OTHER PUBLICATIONS

Examination Report from counterpart European Application No. 13188197.1, dated Apr. 4, 2014, 5 pp.

Response to Examination Report dated Apr. 4, 2014, from counterpart European Patent Application No. 13188197.1, filed Oct. 13, 2014, 14 pp.

* cited by examiner

CMOS LOGIC CIRCUIT USING PASSIVE INTERNAL BODY TIE BIAS

This disclosure relates to complementary metal-oxide-semiconductor (CMOS) integrated circuits, and more particularly, to CMOS integrated circuit electronic circuits fabricated in a partially depleted silicon on insulator (SOI) process.

BACKGROUND

Reduction of power consumption in integrated circuits (IC's) is an ongoing concern in IC development. One way to lower the power consumption of an IC is to reduce the power supply voltage. Reduction of the power supply voltage is generally constrained by the need to meet the circuit's metal oxide semiconductor (MOS) threshold voltage (Vt). Silicon on insulator (SOI) CMOS may be used in place of bulk CMOS as one way to reduce parasitic capacitances and support a lower threshold voltage. Another way to support a lower threshold voltage is to apply a body tie bias from a body contact to a body region, which may be positioned in remote locations from each other in an SOI substrate, with the body tie providing a conductive path between those potentially remote locations.

SUMMARY

This disclosure is directed to devices, integrated circuits, and methods for implementing an internal body tie bias circuit in a CMOS logic circuit.

In one example, a CMOS logic circuit is formed in an integrated circuit. The CMOS logic circuit includes a PMOS transistor, an NMOS transistor; and a body tie bias circuit formed in the integrated circuit. The body tie bias circuit is coupled between a body tie connection terminal of the PMOS transistor and a body tie connection terminal of the NMOS transistor.

In another example, a method includes applying an internal body tie bias voltage through an internal body tie bias circuit between a body tie connection terminal of a PMOS transistor and a body tie connection terminal of an NMOS transistor in a CMOS logic circuit. The PMOS transistor includes a source gate coupled to a source voltage, and the internal body tie bias circuit includes one or more diodes connected in series between the body tie connection terminal of a PMOS transistor and the body tie connection terminal of an NMOS transistor.

The details of one or more examples are set forth in the accompanying drawings and the description below. Other features, objects, and advantages will be apparent from the description and drawings, and from the claims.

DETAILED DESCRIPTION

Various examples are described below generally directed to devices, integrated circuits, systems, and methods for CMOS logic circuits using a body tie bias circuit internal to a logic cell to apply a passive body tie bias, instead of using external, actively biased body ties. Such a passive internal body tie bias circuit may couple the body tie connection terminals of an NMOS transistor and a PMOS transistor in a CMOS logic gate or other logic cell. The use of an internal body tie bias circuit may effectively reduce the threshold voltage of MOS transistors, and allow for reduction of the supply voltage for CMOS logic gates with the same functions or the same performance as with a higher supply voltage, among other advantages. This may also provide a body tie bias without requiring an externally supplied body tie bias, and without requiring the additional fabrication processing, circuit volume, and complexity of traditional external body ties, for example, among other advantages.

In various examples, a circuit as described herein may be implemented entirely in complementary metal-oxide-semiconductor (CMOS) circuitry that may be incorporated in any CMOS integrated circuit. A CMOS logic circuit using an internal, passive body tie bias circuit may be implemented as a portion of a larger integrated circuit, and may be implemented with a relatively small size, low mass, and low cost, in various examples.

Figure 1:
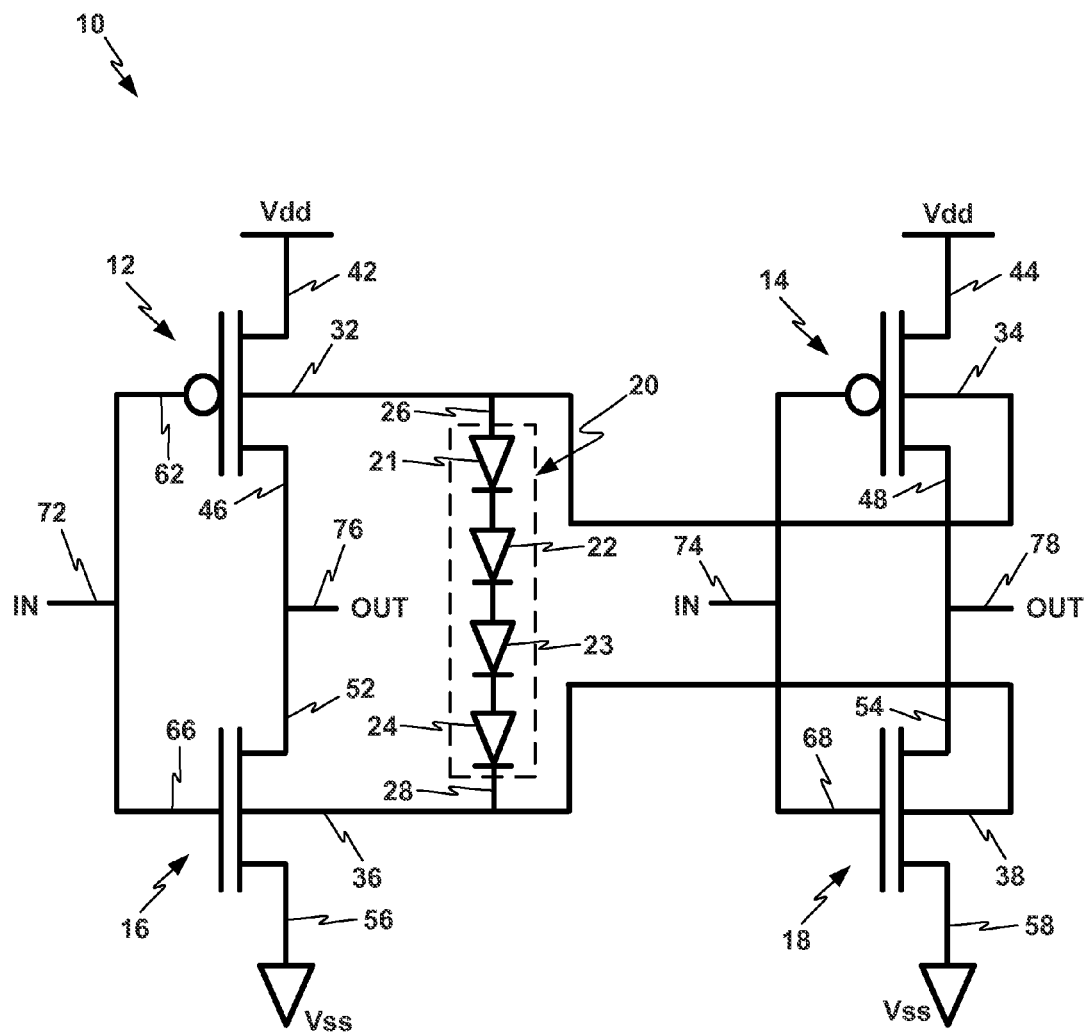
FIG. 1 is a circuit diagram depicting a CMOS logic circuit using a passive internal body tie bias circuit integrated into a CMOS logic circuit, in accordance with an illustrative example of this disclosure.

FIG. 1 is a circuit diagram depicting a CMOS logic circuit 10 using a passive internal body tie bias circuit 20 integrated into CMOS logic circuit 10, in accordance with an illustrative example of this disclosure. CMOS logic circuit 10 in the example of FIG. 1 is one illustrative example of a CMOS logic circuit that may be implemented with an internal body tie bias circuit 20. Body tie bias circuit 20 is internal in that it is formed as an internal part in the integrated circuit of CMOS logic circuit 10. Many other types of CMOS logic circuits may also be implemented with an internal body tie, as further described below.

CMOS logic circuit 10 in the example of FIG. 1 includes PMOS transistors 12 and 14 and NMOS transistors 16 and 18. The terminal 32 of PMOS transistor 12 is coupled to the terminal 34 of PMOS transistor 14, and the terminal 36 of NMOS transistor 16 is coupled to the terminal 38 of NMOS transistor 18. Internal body tie bias circuit 20 is connected between terminals 32, 34 of PMOS transistors 12, 14, and terminals 36, 38 of NMOS transistors 16, 18, whereby terminals 32, 34, 36, 38 function as body tie connection terminals. A first end 26 of internal body tie bias circuit 20 is coupled to body tie connection terminals 32, 34 of PMOS transistors 12, 14, and a second end 28 of internal body tie bias circuit 20 coupled to body tie connection terminals 36, 38 of NMOS transistors 16, 18. Internal body tie bias circuit 20 is thereby coupled between the body tie connection terminals 32, 34 of PMOS transistors 12, 14 and the body tie connection terminals 36, 38 of NMOS transistors 16, 18.

Internal body tie bias circuit 20 thereby enables a small trickle current to flow between the body tie connection terminals 32, 34 of PMOS transistors 12, 14 and the body tie connection terminals 36, 38 of NMOS transistors 16, 18. This passively maintains a body tie bias between body tie connection terminals 32, 34 of PMOS transistors 12, 14 and the body tie connection terminals 36, 38 of NMOS transistors 16, 18, without the need to connect an external body tie bias supply to CMOS logic circuit 10 routed to a remote source of externally applied body tie bias. Internal body tie bias circuit 20 is passive in that it inherently maintains a body tie bias due to its structure, without the need for connection to an actively applied, powered body tie bias from an external body tie bias supply. Passive, internal body tie bias circuit 20 may thereby enable a reduced threshold voltage Vt, reduced area, reduced power supply voltage, and reduced power consumption, and/or provide greater drive to the transistors 12, 14, 16, 18 of CMOS logic circuit 10.

Internal body tie bias circuit 20 includes a number of diodes 21, 22, 23, 24 connected in series, in the illustrative example of FIG. 1. Other types of passive, internal body ties may be implemented with other numbers of diodes and with additional structures, as further described below. While CMOS logic circuit 10 in the example of FIG. 1 has two PMOS transistors 12, 14 and two NMOS transistors 16, 18, other types of CMOS logic circuits with various different numbers of transistors, including one or more PMOS transistors and one or more NMOS transistors, may also use internal body ties, in other examples.

Internal body tie bias circuit 20 may passively maintain a body tie bias between body tie connection terminals 32, 34 of PMOS transistors 12, 14 and body tie connection terminals 36, 38 of NMOS transistors 16, 18 that maintains a sufficient voltage difference between body tie connection terminals 32, 34 of PMOS transistors 12, 14 and body tie connection terminals 36, 38 of NMOS transistors 16, 18 to maintain the threshold voltage Vt of PMOS transistors 12, 14 and NMOS transistors 16, 18. For example, internal body tie bias circuit 20 may maintain a body tie bias voltage of approximately 0.4 volts. In some particular examples, internal body tie bias circuit 20 may maintain a body tie bias of approximately 0.40 to 0.43 volts, or at another voltage within or approximate to the range of 0.3 to 0.6 volts. A bias voltage significantly below this range may be too insignificant to function as a body tie bias voltage, while a bias voltage significantly above this range may be above a practical limit for implementing a body tie bias voltage, as well as adding additional structure and area beyond what is needed to apply a body tie bias. A passive internal body tie may maintain another value of bias voltage outside of this illustrative range, either lower or higher, in other examples, within engineering design constraints. In the particular illustrative example of FIG. 1, wherein internal body tie bias circuit 20 has four diodes, CMOS logic circuit 10 may operate with a source voltage Vdd of 2.5 volts, applied to the source gates 42, 44 of PMOS transistors 12, 14, and internal body tie bias circuit 20 may maintain a body tie bias voltage of approximately 0.4 to 0.42 volts between body tie connection terminals 32, 34 of PMOS transistors 12, 14 and body tie connection terminals 36, 38 of NMOS transistors 16, 18.

CMOS logic circuit 10 also includes signal IN terminals 72, 74 coupled to the inputs 62, 64, 66, 68 of PMOS transistors 12, 14 and NMOS transistors 16, 18. The drain gate 46 of PMOS transistor 12 and the source gate 52 of NMOS transistor 16 are coupled to a signal OUT terminal 76, and the drain gate 48 of PMOS transistor 14 and the source gate 54 of NMOS transistor 18 are coupled to a signal OUT terminal 78. The drain gates 56, 58 of NMOS transistors 16, 18 are coupled to drain voltage Vss. CMOS logic circuit 10 is enabled to receive and maintain state signals for future reading, and therefore function as a memory cell, and potentially as a building block of a larger memory.

Internal body tie bias circuit 20 is passive in that it automatically applies a body tie bias between the body tie connection terminals of the MOS transistors within CMOS logic circuit 10 without requiring an actively applied bias independently connected to an external source of body tie bias voltage. Internal body tie bias circuit 20 is internal in that is formed as part of CMOS logic circuit 10 as an integral part of CMOS logic circuit 10, and removes the need for the additional complication and area of external body tie bias supply routing connections. While internal body tie bias circuit 20 in the example of FIG. 1 has four diodes, various implementations of a passive internal body tie bias may also be formed with various other numbers of diodes and other features, as further described with reference to FIGS. 2 and 4.

Figure 2:
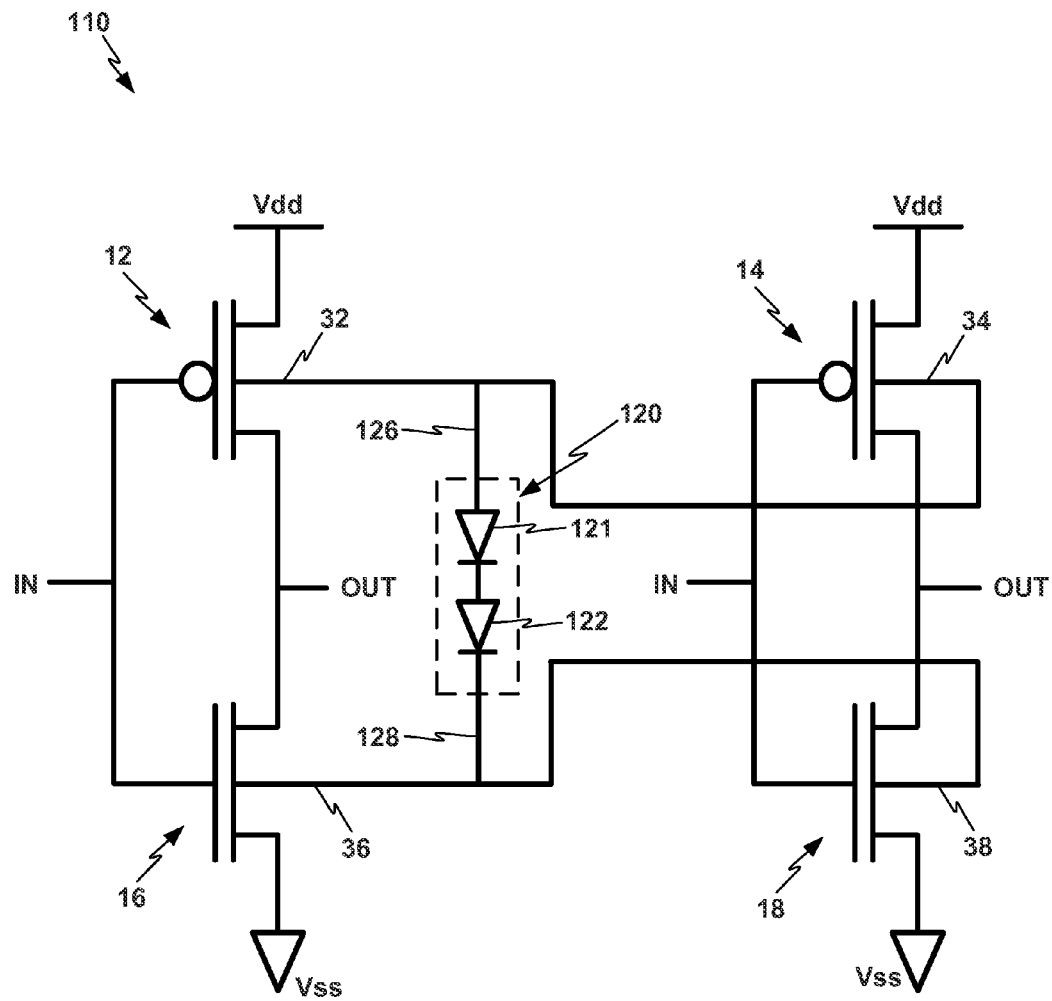
FIG. 2 is a circuit diagram depicting another example of a CMOS logic circuit identical to CMOS logic circuit of FIG. 1 except for the internal body tie bias circuit, which provides a different implementation of a passive internal body tie bias circuit, in accordance with an illustrative example of this disclosure.

FIG. 2 is a circuit diagram depicting another example of a CMOS logic circuit 110 identical to CMOS logic circuit 10 of FIG. 1 except for internal body tie bias circuit 120, which provides a different implementation of a passive internal body tie, in accordance with an illustrative example of this disclosure. Internal body tie bias circuit 120 has only two diodes 121, 122 in this example. Otherwise, CMOS logic circuit 110 in the example of FIG. 2 is the same as the example of FIG. 1, with first end 126 of internal body tie bias circuit 120 coupled to body tie connection terminals 32, 34 of PMOS transistors 12, 14, and second end 128 of internal body tie bias circuit 120 coupled to body tie connection terminals 36, 38 of NMOS transistors 16, 18. Internal body tie bias circuit 120 is thereby coupled between the body tie connection terminals 32, 34 of PMOS transistors 12, 14 and the body tie connection terminals 36, 38 of NMOS transistors 16, 18. Internal body tie bias circuit 120 thereby conducts a small trickle current and applies a body tie bias between the body tie connection terminals 32, 34 of PMOS transistors 12, 14 and the body tie connection terminals 36, 38 of NMOS transistors 16, 18.

Other examples of a body tie bias may include still other numbers of diodes, such as six, eight, or any number of diodes. Various criteria may be used in selecting a number of diodes for a passive internal body tie bias for a CMOS logic circuit. Different values of body tie bias voltage may be selected by selecting the number of diodes, with reference to the source voltage of the circuit. Generally, in CMOS logic circuits in the form of the examples of FIGS. 1 and 2 or with a body tie with an arbitrary number of diodes, the body tie bias voltage is related to the source voltage as shown in Equation 1:

$$Vb = Vdd/(M+2) \qquad (Eq. 1)$$

In Equation 1, Vb indicates body tie bias voltage, Vdd indicates source voltage, and M indicates the number of diodes connected in series in the body tie. The denominator is equal to M+2 because the overall body tie bias voltage is also affected by the diodes within the MOS transistors, which are also added in series with the diodes within the body tie. As seen in Equation 1, the more diodes that are used in the internal body tie, the lower the body tie bias voltage is, relative to the source voltage. The number of diodes for the body tie bias may therefore be selected in view of the source voltage applicable to a particular CMOS circuit. Therefore, with PMOS transistors 12, 14 including source gates coupled to source voltage, the internal body tie bias circuits 20, 120 may include a number of diodes (e.g., 4 diodes in internal body tie bias circuit 20 of FIG. 1, 2 diodes in internal body tie bias circuit 120 of FIG. 2, etc.), and the body tie applies a body tie bias voltage between the body tie connection terminal of the PMOS transistor and the body tie connection terminal of the NMOS transistor, where the body tie bias voltage equals the source voltage divided by two plus the number of diodes in the body tie.

In some illustrative examples, CMOS circuits may operate with a system source voltage within or near a range of approximately 1.2 to 5.0 volts. For example, CMOS circuits may operate with a system source voltage of approximately 1.2 volts, 1.8 volts, 2.5 volts, 3.3 volts, or 5.0 volts, or other voltage levels within or near this range. In some examples, CMOS circuits may operate with a system source voltage of less than or equal to approximately 1.8 volts. In these examples, the source voltage may be considered to be "approximately" a particular value of voltage if the real source voltage generally remains nominally within a restricted voltage range around that particular value, or if the particular value accurately represents the source voltage within the understanding of CMOS circuit designing engineers. In some of these examples, it may be a design goal to apply or provide a body tie bias voltage within a range of approximately 0.3 to 0.6 volts, and in particular, to apply a body tie bias voltage of approximately 0.40 to 0.44 volts in some examples. An internal body tie bias circuit may apply a body tie bias voltage of approximately 0.40 volts where the real body tie bias voltage may be within a range of 0.3 to 0.6 volts in some examples. In selecting the number of diodes to include in the body tie, Equation 1 may be rearranged to isolate M, the number of diodes, to yield Equation 2:

$$M=(Vdd/Vb)-2 \quad (Eq. 2)$$

Therefore, with a body tie that includes a number M of diodes in series, the number of diodes may be selected to be equal to a voltage ratio (Vdd/Vb) minus two, where the voltage ratio (Vdd/Vb) is determined as the source voltage Vdd divided by the body tie bias voltage Vb of the body tie. The number M of diodes connected in series in the body tie may be selected with reference to the source voltage Vdd and the desired body tie bias voltage Vb, which may be within a range of between approximately 0.3 and 0.6 volts in some examples. In other examples, a body tie bias voltage below approximately 0.3 volts or above 0.6 volts may also be a design goal, in view of a desired MOS transistor threshold voltage for particular MOS transistors used in a CMOS circuit, and the number M of diodes with reference to the source voltage may be selected accordingly as in Equation 2.

When designing a circuit implementing an internal body tie bias circuit in accordance with Equation 2, using initial values of a known source voltage and a desired body tie bias voltage may initially yield a non-integer number for the appropriate number of diodes with which to implement the internal body tie bias circuit. In this case, however, the desired body tie bias voltage may have some flexibility and may be adjusted accordingly. In many applications, any body tie bias voltage within a particular range, such as approximately 0.3 to 0.6 volts, may be desirable or advantageous. It will be understood that the operating source voltage itself may exhibit some degree of variation within a few tenths of a volt in acceptable, nominal operation. For example, a circuit with a source voltage of 1.8 volts may have a nominal range of 0.15 volts higher or lower than 1.8 volts, and a circuit with a source voltage of 2.5 volts may have a nominal range of 0.2 volts higher or lower than 2.5 volts. Various other range values for a nominal range may be applicable in other examples. It may therefore be understood that a reference to a source voltage of, for example, 2.5 volts indicates that the source voltage may nominally be within a range of 2.3 to 2.7 volts, for example. It may also be understood that a target body tie bias voltage may nominally vary in its range by similar amounts, such that a body tie bias voltage with a nominal value of 0.43 volts may nominally vary within a range of 0.39 to 0.47 volts, for example, and any body tie bias voltage within this range may be acceptable to maintain a proper threshold voltage for a CMOS logic circuit. In applications in which a more precise value of body tie bias voltage is desired, additional structure may be included to refine the body tie bias voltage of the selected body tie. Various body ties may also be used with structures beyond a set of diodes in series.

For example, applying Equation 2 to a desired body tie bias voltage of approximately 0.4 volts, as a representative value with an acceptable range of variation of 0.05 or 0.1 volts either higher or lower, to the particular examples of 1.2 volts, 1.8 volts, 2.5 volts, 3.3 volts, or 5.0 volts for the source voltage, yields initial results of 1.0, 2.5, 4.25, 6.25, and 10.5, respectively. Each of these values may then be rounded down to the nearest integer, thereby indicating 1, 2, 4, 6, or 10 diodes, respectively, for the internal body tie for CMOS circuits with a source voltage of 1.8 volts, 2.5 volts, 3.3 volts, or 5.0 volts, respectively. That is, in these examples, a CMOS logic circuit with a source voltage of 1.8 volts may include a body tie that has two diodes connected in series, as in the example shown in FIG. 2; a CMOS logic circuit with a source voltage of 2.5 volts may include a body tie that has four diodes connected in series, as in the example shown in FIG. 1; a CMOS logic circuit with a source voltage of 3.3 volts may include a body tie that has six diodes connected in series; and a CMOS logic circuit with a source voltage of 5.0 volts may include a body tie that has ten diodes connected in series.

Each of these examples may thereby result in a body tie bias voltage of approximately 0.4 to 0.45 volts. In particular, these numbers of diodes with their respective source voltage values may be applied to Equation 1 to evaluate their resulting body tie bias voltage (e.g., for four diodes and a source voltage of 1.8 volts, for six diodes and a source voltage of 2.5 volts, for eight diodes and a source voltage of 3.3 volts, for 12 diodes and a source voltage of 5.0 volts), yielding approximate values of 0.45, 0.42, 0.41, and 0.40 volts, respectively. Each of these values may be acceptable for the body tie bias voltage in their respective CMOS logic circuits. Equation 2 may also be used to select a number of diodes to include for CMOS circuits with other values of source voltage besides the examples discussed here, and Equation 1 may also be used to confirm the resulting body tie bias voltage.

Using an internal body tie bias circuit may be especially advantageous for lower power supply voltages. When using an externally applied bias source, the lower the power supply voltage, the proportionally larger the external body tie bias supply connections may be relative to the area of the circuit. On the other hand, when using an internal body tie bias circuit, the lower the power supply voltage, the less structure is required to implement an internal body tie bias circuit. For example, as noted above, in a circuit with a source voltage of approximately 1.8 volts, an internal body tie bias circuit may be implemented with only two diodes, while in a circuit with a source voltage of approximately 1.2 volts, an internal body tie bias circuit may be implemented with only one diode. This may also include a transistor being used as a diode. As Equation 1 shows, if a body tie bias voltage of down to approximately 0.3 volts is used, an internal body tie bias circuit having a single diode may be implemented with a source voltage of below 1.0 volt, down to approximately 0.9 volts.

Furthermore, as Equation 2 shows, for a source voltage below 1.0 volt, an internal body tie bias circuit may be implemented with no diodes. Rather, a direct connection between the n and p body tie connection terminals, or a direct connection between the body tie connection terminals of an NMOS transistor and a PMOS transistor, may function as an internal body tie bias circuit, providing a body tie bias voltage in a range of approximately 0.3 to 0.6 volts. For example, a circuit may be implemented with a source voltage of approximately 0.8 volts, and an internal body tie bias circuit having a direct connection with no diodes between the body tie connection terminals of an NMOS transistor and a PMOS transistor, that provides an internal body tie bias voltage of approximately 0.4 volts.

Figure 3:
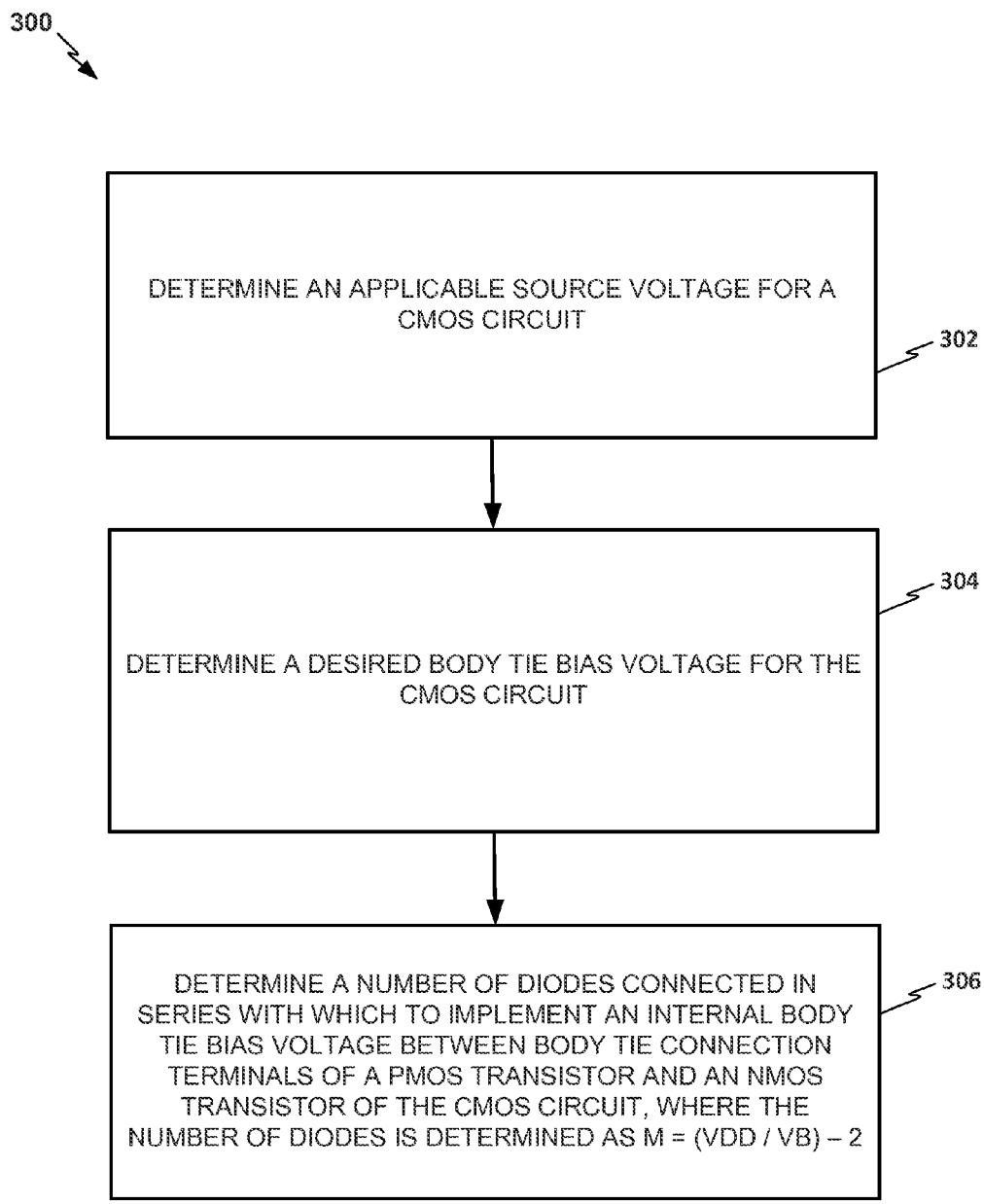
FIG. 3 depicts a flowchart for an example process for designing an internal body tie bias circuit, in accordance with illustrative aspects of this disclosure.

FIG. 3 depicts a flowchart for an example process 300 for designing an internal body tie bias circuit, in accordance with illustrative aspects of this disclosure. In this example, design process 300 includes determining an applicable source voltage for a CMOS circuit (302), and determining a desired body tie bias voltage for the CMOS circuit (304). Process 300 then includes determining a number of diodes connected in series with which to implement an internal body tie bias voltage between body tie connection terminals of a PMOS transistor and an NMOS transistor of the CMOS circuit, by applying Equation 2 to the applicable source voltage and the desired body tie bias voltage, where the number of diodes is determined as M=(Vdd/Vb)−2 (306) (potentially with appropriate rounding or approximation, as discussed above).

Other examples may use any number of one or more diodes in an internal body tie. Other types of passive internal body ties of this disclosure may also be used, which may provide various other advantages. For example, an internal body tie may include not just a set of diodes in series, but also a diode-coupled MOS transistor, an example of which is shown in FIG. 4.

Figure 4:
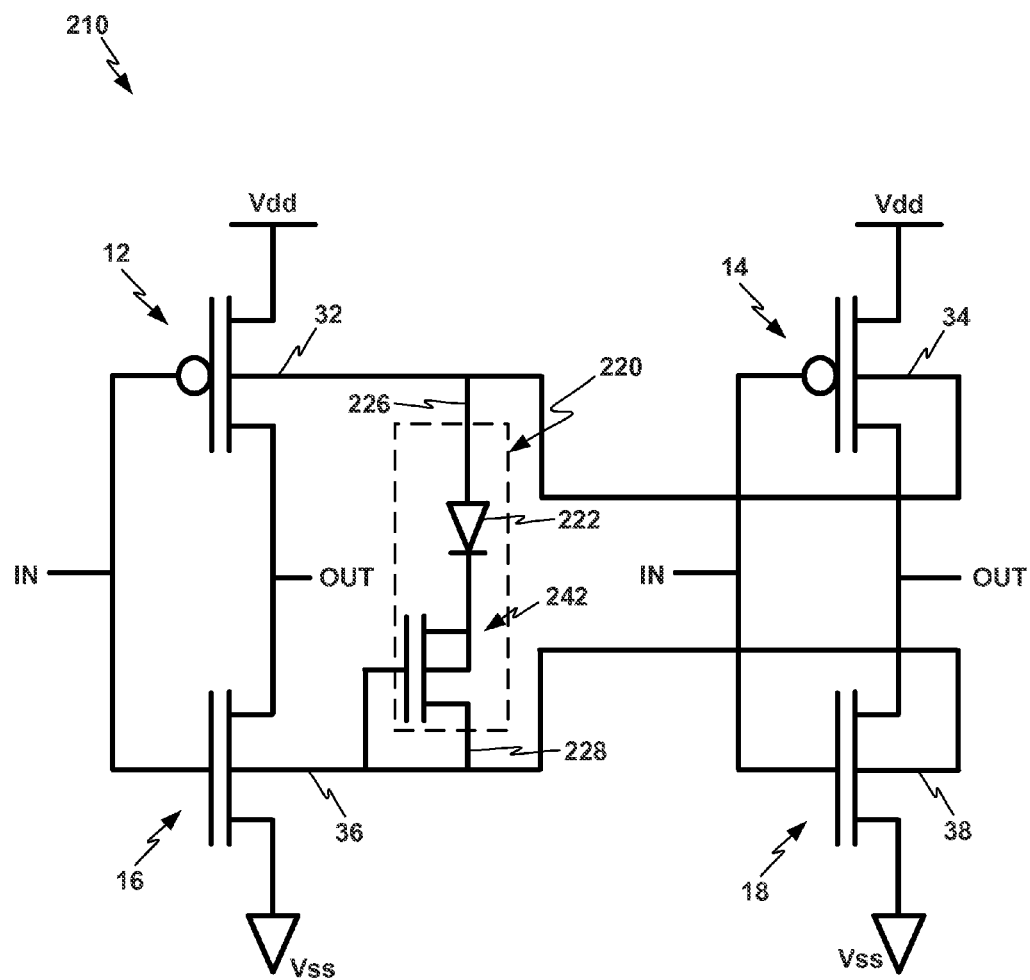
FIG. 4 is a circuit diagram depicting another example of a CMOS logic circuit identical to the CMOS logic circuit of FIG. 1 and CMOS logic circuit of FIG. 2 except for the internal body tie bias circuit, which provides another implementation of a passive internal body tie bias circuit, in accordance with an illustrative example of this disclosure.

FIG. 4 is a circuit diagram depicting another example of a CMOS logic circuit 210 identical to CMOS logic circuit 10 of FIG. 1 and CMOS logic circuit 110 of FIG. 2 except for internal body tie bias circuit 220, which provides another implementation of a passive internal body tie, in accordance with an illustrative example of this disclosure. In the example of FIG. 4, internal body tie bias circuit 220 includes a diode-coupled MOS transistor, with MOS transistor 242 coupled to a diode 222. At the first end 226 of internal body tie bias circuit 220, diode 222 is coupled to the body tie connection terminal 32 of PMOS transistor 12. At the second end 228 of internal body tie bias circuit 220, MOS transistor 242 is coupled to the body tie connection terminal 36 of NMOS transistor 16.

A diode series internal body tie such as internal body tie bias circuits 20, 120 of FIGS. 1 and 2 and a diode-coupled MOS transistor internal body tie such as internal body tie bias circuit 220 of FIG. 4 may each offer different advantages that may be more suitable for different applications. A diode-coupled MOS transistor internal body tie such as internal body tie bias circuit 220 of FIG. 4 may provide a lower turn-on voltage or a higher current relative to voltage, and may be more advantageous for a higher drive load circuit with relatively more transistors, such as CMOS logic cells with more than the four MOS transistors in the examples of FIGS. 1, 2, and 4. This may be the case for relatively more complex CMOS logic gates, for example. On the other hand, a diode series internal body tie such as internal body tie bias circuits 20, 120 of FIGS. 1 and 2 may provide lower parasitic capacitances than a diode-coupled MOS transistor internal body tie, and may enable benefits such as reduced power consumption. A diode series internal body tie may be relatively more advantageous in CMOS logic cells with relatively fewer MOS transistors, such as a circuit with four MOS transistors as in the examples of FIGS. 1, 2, and 4.

Figure 5:
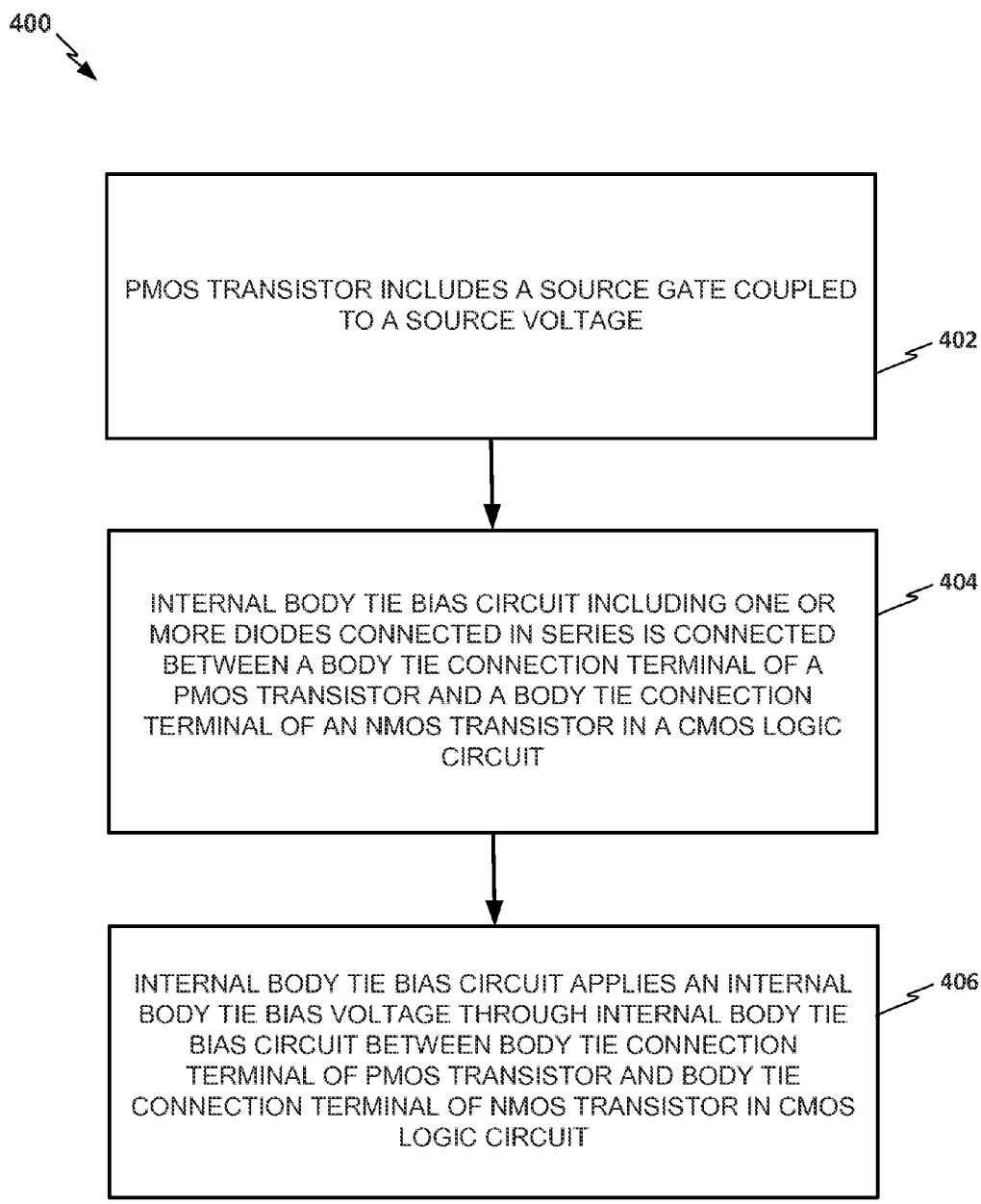
FIG. 5 depicts a flowchart for an example process for the operation of an internal body tie bias circuit, in accordance with illustrative aspects of this disclosure.

FIG. 5 depicts a flowchart for an example process 400 for the operation of an internal body tie bias circuit, in accordance with illustrative aspects of this disclosure. In process 400, a PMOS transistor includes a source gate coupled to a source voltage (402), and an internal body tie bias circuit including one or more diodes connected in series is connected between a body tie connection terminal of a PMOS transistor and a body tie connection terminal of an NMOS transistor in a CMOS logic circuit (404). The internal body tie bias circuit then applies an internal body tie bias voltage through the internal body tie bias circuit between the body tie connection terminal of the PMOS transistor and the body tie connection terminal of the NMOS transistor in the CMOS logic circuit (406).

The particular advantages and benefits of either of these types of internal body ties may depend, however, on a range of details, including not only the number of MOS transistors in a logic cell, but also the operating source voltage of the logic cell, and additional design parameters. Internal body ties may be advantageously applied in any of a wide range of CMOS logic cells, including a flip-flop, a latch, an AND gate, an OR gate, an inverter, a NAND gate, a NOR gate, an XAND gate, an XOR gate, or other logic cells, including compound logic gates such as AND-OR-Invert (AOI) and OR-AND-Invert (OAI) gates, or other, more complex ones than those listed here. While a diode series internal body tie may be relatively more advantageous in logic cells with relatively fewer MOS transistors and diode-coupled MOS transistor internal body ties may be relatively more advantageous in logic cells with relatively more MOS transistors, either type of internal body tie may be advantageously applied in any of the above or other logic cells, and the relative advantage of one over the other may depend on other design details as indicated above.

Multiple CMOS logic cells incorporating internal body ties in any of the examples discussed above may be included in larger circuits, such as an application-specific integrated circuit (ASIC), for example. An ASIC may include one or more, including thousands, millions, or any number, of CMOS logic circuits that include internal body ties in accordance with any of the examples disclosed herein. A CMOS logic circuit with an internal body tie bias may be formed in a silicon-on-insulator (SOI) integrated circuit, or in a bulk CMOS integrated circuit, for example. A CMOS logic circuit may include one or more CMOS logic gates or other logic cells, and a body tie of this disclosure may be formed as an integrated part of the logic cell.

A CMOS logic circuit or other device that includes an internal body tie as disclosed above may be implemented in any of a variety of additional types of circuit elements in addition to ASICs, such as a magnetic nonvolatile random-access memory (RAM) or other types of memory, a mixed-signal integrated circuit, a central processing unit (CPU), a field programmable gate array (FPGA), a microcontroller, a programmable logic controller (PLC), a system on a chip (SoC), a subsection of any of the above, an interconnected or distributed combination of any of the above, or any other type of component or one or more components capable of being configured with an internal body tie in accordance with any of the examples disclosed herein.

A CMOS logic circuit using an internal body tie as in any of the examples herein may provide additional advantages in any of a variety of applications, such as radiation hardened circuits, for example. An internal body tie as disclosed herein may mitigate glitching and state changes induced by ions, cosmic rays, or other radiation, for example. An internal body tie as disclosed herein may also be used in any of a variety of general-purpose CMOS logic.

The techniques described herein may be able to produce integrated circuits that implement logic using a CMOS process technology. The circuit components described in this disclosure can be implemented as discrete components, as one or more elements of one or more integrated devices, or any combination thereof. The circuit components described herein may be fabricated using any of a wide variety of process technologies including CMOS process technologies, including either standard or custom CMOS process technologies. In addition, the circuitry described herein may be used in various applications including telecommunications applications, general computing applications, or any application that may make use of an integrated circuit with a body tie bias.

Various aspects of the disclosure have been described. These and other aspects are within the scope of the following claims.

The invention claimed is:

1. A device comprising:
    a CMOS logic circuit formed in an integrated circuit, the CMOS logic circuit comprising:
        a PMOS transistor;
        an NMOS transistor; and
        a body tie bias circuit formed in the integrated circuit, wherein the body tie bias circuit is coupled only to a body tie connection terminal of the PMOS transistor and a body tie connection terminal of the NMOS transistor,
    wherein the PMOS transistor is a first PMOS transistor and the NMOS transistor is a first NMOS transistor, wherein the CMOS logic circuit further comprises:
        a second PMOS transistor; and
        a second NMOS transistor,
        wherein the body tie connection terminal of the first PMOS transistor is shared in common with the second PMOS transistor as a body tie connection terminal of the first and second PMOS transistors, and the body tie connection terminal of the first NMOS transistor is shared in common with the second NMOS transistor as a body tie connection terminal of the first and second NMOS transistors, such that the body tie bias circuit is coupled only to the body tie connection terminal of the first and second PMOS transistors and the body tie connection terminal of the first and second NMOS transistors.

2. The device of claim 1, wherein the body tie bias circuit applies a body tie bias voltage between the body tie connection terminal of the first and second PMOS transistors and the body tie connection terminal of the first and second NMOS transistors.

3. The device of claim 1, wherein the body tie bias circuit comprises a plurality of diodes connected in series.

4. The device of claim 3, wherein the first PMOS transistor comprises a source gate coupled to a source voltage, the body tie bias circuit comprises a number of diodes, and the body tie bias circuit applies a body tie bias voltage between the body tie connection terminal of the first and second PMOS transistors and the body tie connection terminal of the first and second NMOS transistors.

5. The device of claim 4, wherein the body tie bias voltage equals the source voltage divided by two plus the number of diodes in the body tie bias circuit.

6. The device of claim 1, wherein the body tie bias circuit comprises a diode-coupled MOS transistor.

7. The device of claim 6, wherein the diode-coupled MOS transistor comprises a diode and a MOS transistor, wherein the diode is coupled to the body tie connection terminal of the first and second PMOS transistors, and the MOS transistor is coupled to the body tie connection terminal of the first and second NMOS transistors.

8. The device of claim 1, wherein the device comprises an application-specific integrated circuit (ASIC), wherein the application-specific integrated circuit (ASIC) comprises the CMOS logic circuit.

9. The device of claim 1, wherein the CMOS logic circuit is formed in a silicon-on-insulator (SOI) integrated circuit.

10. The device of claim 1, wherein the CMOS logic circuit is formed in a bulk CMOS integrated circuit.

11. The device of claim 1, wherein the CMOS logic circuit comprises at least one of a flip-flop, a latch, an AND gate, an OR gate, an inverter, a NAND gate, a NOR gate, an XAND gate, or an XOR gate.

12. The device of claim 1, wherein the CMOS logic circuit has a source voltage of approximately 1.2 volts, and the body tie bias circuit has one diode.

13. The device of claim 1, wherein the CMOS logic circuit has a source voltage of approximately 1.8 volts, and the body tie bias circuit has two diodes connected in series.

14. The device of claim 1, wherein the CMOS logic circuit has a source voltage of approximately 2.5 volts, and the body tie bias circuit has four diodes connected in series.

15. The device of claim 1, wherein the CMOS logic circuit has a source voltage of approximately 3.3 volts, and the body tie bias circuit has six diodes connected in series.

16. The device of claim 1, wherein the body tie bias circuit provides a body tie bias voltage of between 0.3 and 0.6 volts between the body tie connection terminal of the first and second PMOS transistors and the body tie connection terminal of the first and second NMOS transistors.

17. The device of claim 1, wherein the body tie bias circuit comprises a number of diodes in series, and the number of diodes is equal to a voltage ratio minus two, where the voltage ratio is determined as a source voltage divided by a body tie bias voltage of the body tie bias circuit.

18. The device of claim 17, wherein the body tie bias voltage is within a range of between 0.3 and 0.6 volts.

* * * * *